United States Patent [19]
Kertis et al.

[11] Patent Number: 5,736,952
[45] Date of Patent: Apr. 7, 1998

[54] CURRENT BOOST FOR DIFFERENTIAL FLASH ANALOG TO DIGITAL CONVERTER DRIVER

[75] Inventors: Robert Andrew Kertis; Joe Martin Poss, both of Rochester, Minn.

[73] Assignee: International Business Machines Corporation, Armonk, N.Y.

[21] Appl. No.: 728,043

[22] Filed: Oct. 9, 1996

[51] Int. Cl.⁶ .................................................. H03M 1/36
[52] U.S. Cl. ........................................... 341/159; 341/118
[58] Field of Search ................................. 341/159, 160, 341/158, 118

[56] References Cited

U.S. PATENT DOCUMENTS

| | | | |
|---|---|---|---|
| 4,990,917 | 2/1991 | Kohdaka | 341/159 |
| 5,164,728 | 11/1992 | Matsuzawa et al. | 341/159 |
| 5,291,198 | 3/1994 | Dingwall et al. | 341/159 |
| 5,376,834 | 12/1994 | Carobolante | 327/143 |
| 5,384,569 | 1/1995 | Komatsu | 341/159 |
| 5,589,831 | 12/1996 | Knee | 341/159 |

OTHER PUBLICATIONS

"Differential High–Speed Analog to Digital Converter", Schulte and D.P. Swart, IBM Technical Disclosure Bulletin, vol. 38, No. 01, Jan. 1995, pp. 425–427.

*Primary Examiner*—Jeffrey A. Gaffin
*Assistant Examiner*—Jason L. W. Kost
*Attorney, Agent, or Firm*—Joan Pennington

[57] ABSTRACT

A high speed differential analog to digital converter (ADC) is provided. The high speed differential ADC includes a driver section, a comparator section and a decoder section. The driver section includes a pair of series connected resistor ladders. A positive phase and negative phase emitter follower transistor pair is connected to the pair of series connected resistor ladders. The positive phase and negative phase emitter follower transistor has a collector connected to a supply voltage and has an emitter coupled to a respective one of the pair of series connected resistor ladders. A respective positive phase and negative phase AC current source drives the base of the respective positive phase and negative phase emitter follower transistor. A reference DC current source is coupled to the base of the positive phase and negative phase emitter follower transistors for determining a range of the ADC. A current source transistor pair biases the emitter follower transistor pair. A first transistor of the current source transistor pair supplies current to the positive phase emitter follower transistor and a second transistor of the current source transistor pair supplies current to the negative phase emitter follower transistor. The first transistor has a control node capacitively coupled to the emitter of the negative phase emitter follower transistor and the second transistor having a control node capacitively coupled to the emitter of the positive phase emitter follower transistor.

18 Claims, 7 Drawing Sheets

PRIOR ART

CURRENT BOOST FOR DIFFERENTIAL FLASH ANALOG TO DIGITAL CONVERTER DRIVER

FIELD OF THE INVENTION

The present invention relates to circuits that use a differential voltage input to a comparator, and more particularly, to an improved, faster differential high speed or flash analog to digital converter (ADC).

DESCRIPTION OF THE PRIOR ART

Many flash ADCs use the negative input of a comparator as a static reference voltage. In a differential analog to digital converter (ADC), a differential voltage input is applied to the comparator.

Figure 3:
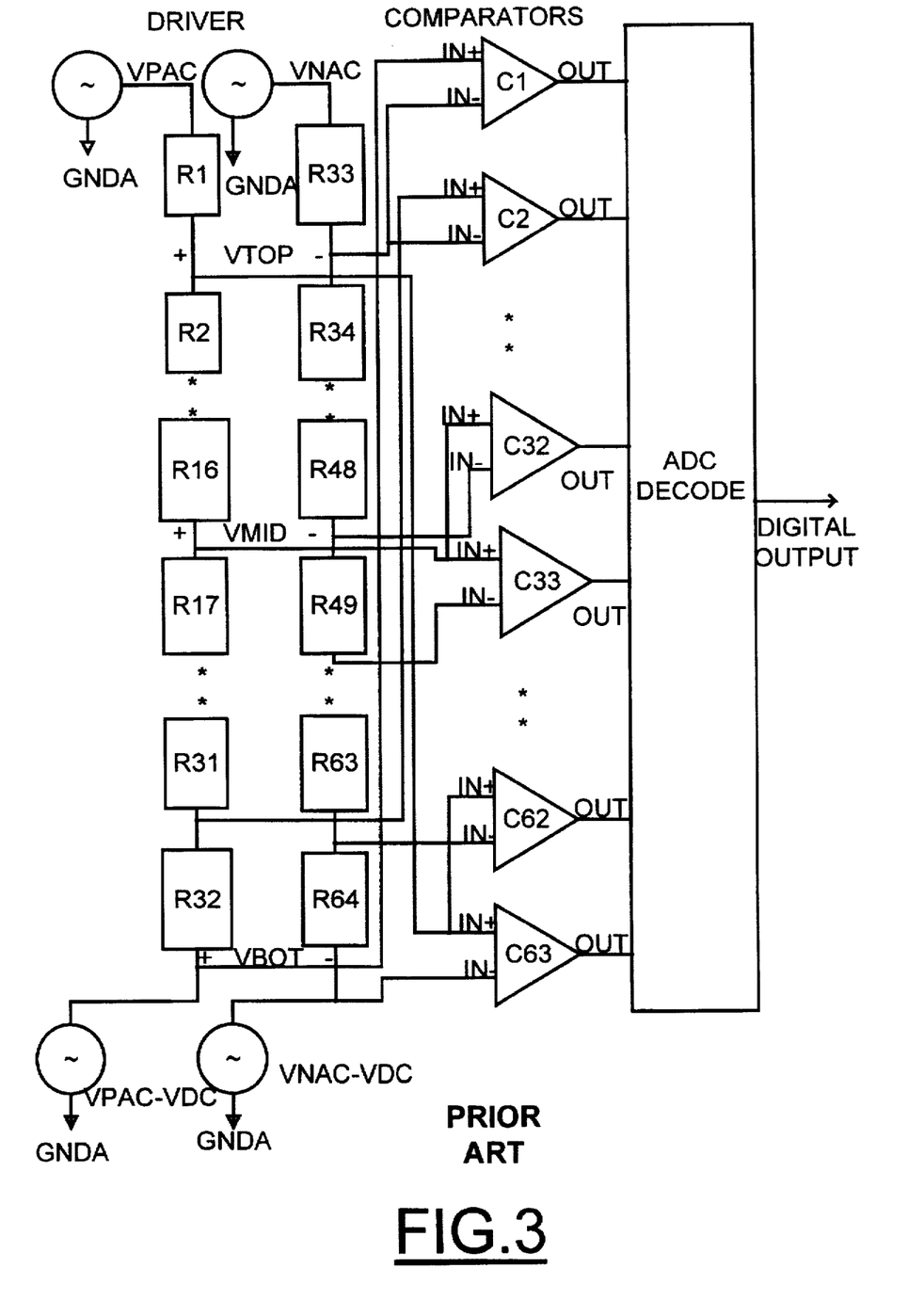
FIG. 3 is a schematic diagram illustrating a conventional high speed differential analog to digital converter.

FIG. 3 illustrates a conventional high speed differential analog to digital converter (ADC) in simplified form. The differential ADC has three sections including a driver section, a comparator section and a decode section. The driver section includes two resistor ladders. Each resistor ladder includes $2^{(N-1)}$ resistors or 32 for the illustrated 6-bit differential flash ADC, where N=6. The comparator section includes a series string of $(2^N)-1$ comparators C1 through C63. The driver section includes four voltage sources to differentially drive both ends of the two resistor ladders. VPAC represents the positive phase of the input signal and VNAC represents the negative phase of the input signal. One side of the ladder (R1 through R32) receives an input signal of an opposite phase of the other side of the ladder (R33 through R64). The voltage source connected to R32 and R64 have a DC voltage as well, represented by VPAC-VDC and VNAC-VDC. This sets the full voltage drop across both resistor ladders and determines the full range of the ADC. The series resistors divide down the full scale input reference voltage into least significant bits (LSBs). Each resistor has a one least significant bit (LSB) DC voltage drop. The differential input signal at the center taps between resistors is DC coupled into the comparator non-inverting and inverting inputs or ports IN+ and IN− of the comparators C1–C63.

The speed of the driver section is limited by the worse case time constant delay of the resistor ladder string. Each resistor and comparator input has associated with it some parasitic capacitance that is generally evenly distributed along the resistor ladder string. The resistors that are closest to the voltage sources will have the least time constant delay and provide the maximum bandwidth. These voltage nodes are labeled VTOP and VBOT. The resistors that are labeled R16, R17, R48 and R49 represent the voltage nodes that have the greatest time constant because they are the greatest resistance from each voltage source. This differential node, labeled +VMID−, as a result determines the maximum speed that can be achieved by the entire ADC driver.

One solution to speed up the ADC driver is to minimize the resistance and capacitance at each node of the ADC ladder. Parasitic capacitance, especially in integrated circuits, is limited to the process and layout of the circuit. Dropping the resistance requires more current to maintain the same ADC voltage range. Doubling the speed of this driver configuration for a given chip process requires a two times increase in power, since the capacitance will not change, the resistance must be decreased by a factor of two for each R*C time delay.

Figure 4:
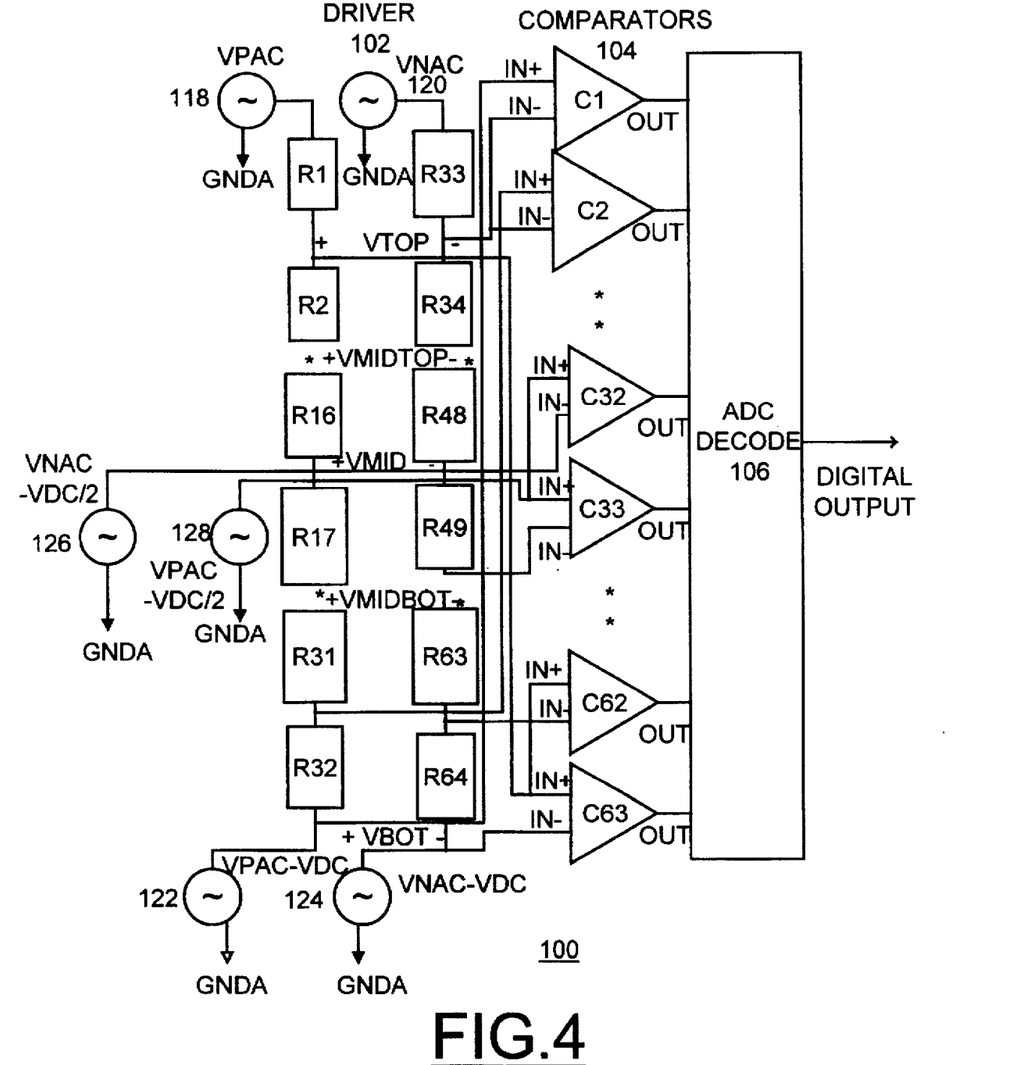
FIG. 4 is a schematic diagram illustrating an alternative high speed differential analog to digital converter.
Figure 5:
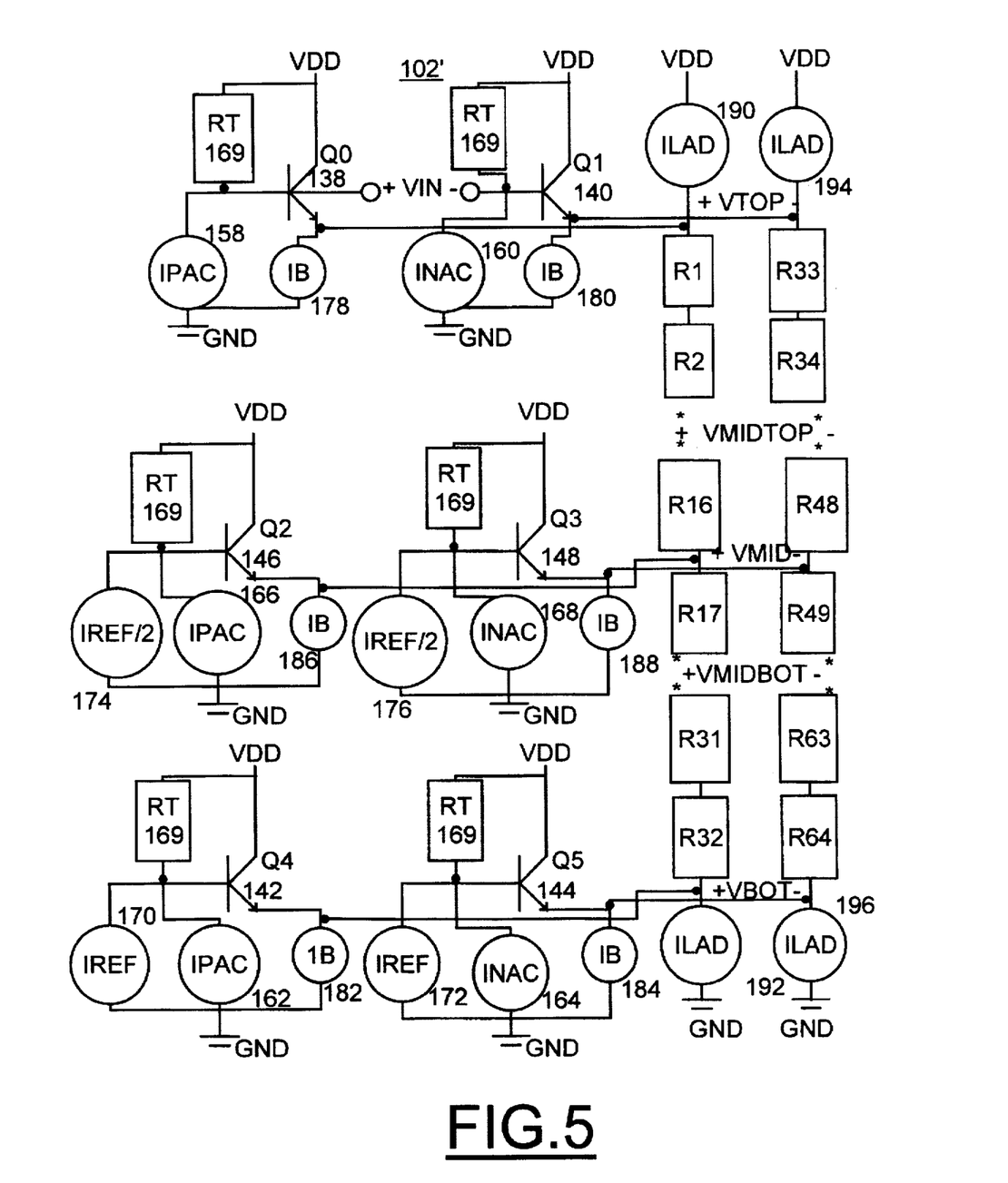
FIG. 5 is a schematic diagram representation of an exemplary high speed differential analog to digital converter driver circuitry.

FIGS. 4 and 5 illustrate an improved high speed differential ADC disclosed in U.S. patent application entitled SPLIT FLASH ANALOG TO DIGITAL CONVERTER DIFFERENTIAL DRIVER, Ser. No. 08/728,044, filed on Oct. 9, 1996, by Poss et al., and assigned to the present assignee. In FIG. 4, the driver section uses six voltage sources to drive six different locations on the two resistor ladders. FIG. 5 shows an implementation of a split high speed differential ADC driver 102'. In FIG. 5, the voltage sources of FIG. 4 are replaced by emitter follower transistor driven by AC current sources IPAC and INAC. IREF and IREF/2 are DC current sources needed to set the full scale range of ADC. IB are DC current sources needed to bias the emitter follower transistors. ILAD are DC current sources needed to supply current to the resistor ladder without requiring current from the emitter follower transistors.

A problem with the split ADC driver design of FIG. 5 is that the emitter follower transistors require a large DC current source IB to maintain adequate bias. This is particularly important for sampled data systems. For example, in sampled data systems the data coming into the flash ADC is sampled and held for a period of time, then the ADC must sample the held waveform. This creates relatively fast rise and fall times of the incoming data. On the rising edge of the input signal the emitter followers will force the nodes VP1, VP2 and VP3 in FIG. 3 up quickly because the current is supplied by the emitter follower transistors. Conversely, the falling edge of the input signal will force the emitter followers to have less current and the DC current source IB is then needed to force nodes VN1, VN2 and VN3 down. The amount of DC current source IB can be a significant portion of the total power and needs to be large in order to provide an adequate falling edge to match the rising edge of the waveform.

A need exists to provide a faster implementation of a differential flash analog to digital converter (ADC) without increasing the power proportionally.

SUMMARY OF THE INVENTION

A principal object of the present invention is to provide an improved high speed differential analog to digital converter (ADC). Other objects are to provide such high speed differential ADC for data detection in a direct access storage device; to provide such high speed differential ADC substantially without negative effects and that overcome many of the disadvantages of prior art arrangements.

In brief, a high speed differential analog to digital converter (ADC) is provided. The high speed differential ADC includes a driver section, a comparator section and a decoder section. The driver section includes a pair of series connected resistor ladders. A positive phase and negative phase emitter follower transistor pair is connected to the pair of series connected resistor ladders. The positive phase and negative phase emitter follower transistor has a collector connected to a supply voltage and has an emitter coupled to a respective one of the pair of series connected resistor ladders. A respective positive phase and negative phase AC current source drives the base of the respective positive phase and negative phase emitter follower transistors. A reference DC current source is coupled to the base of the positive phase and negative phase emitter follower transistors for determining a range of the ADC. A current source transistor pair biases the emitter follower transistor pair. A first transistor of the current source transistor pair supplies current to the positive phase emitter follower transistor and a second transistor of the current source transistor pair supplies current to the negative phase emitter follower transistor. The first transistor has a control node capacitively coupled to the emitter of the negative phase emitter follower transistor and the second transistor having a control node capacitively coupled to the emitter of the positive phase emitter follower transistor.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
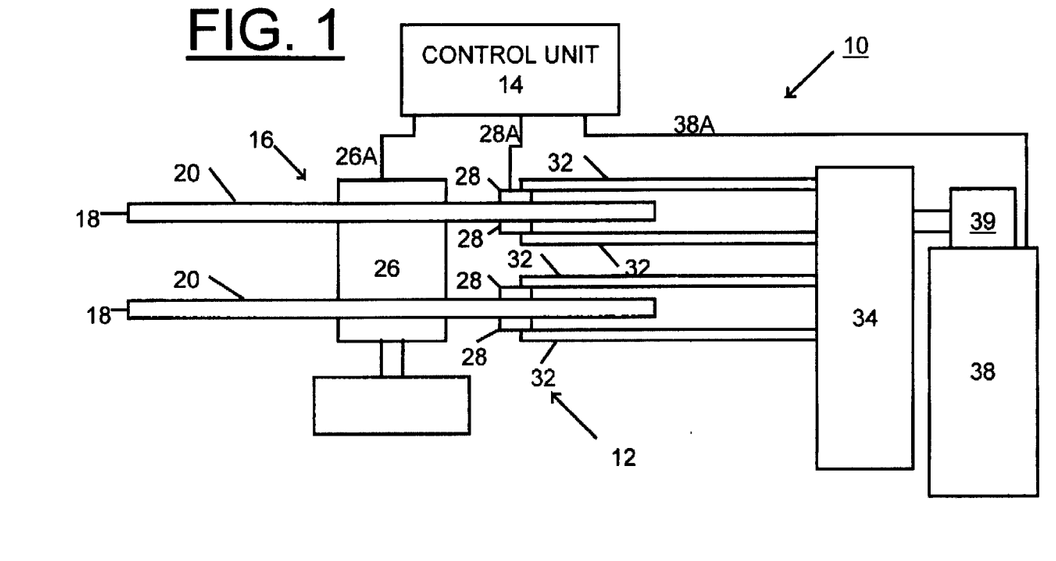
FIG. 1 is a schematic and block diagram of a data storage disk file embodying the present invention.

Having reference now to the drawings, in FIG. 1 there is illustrated a data storage disk file generally designated as 10 including a rigid magnetic disk drive unit 12 and an interface control unit generally designated as 14. Unit 12 is illustrated in simplified and diagrammatic form sufficient for an understanding of the present invention. The utility of the present invention is not restricted to the details of a particular drive unit construction.

The disk drive unit 12 includes a stack 16 of disks 18 each having at least one magnetic surface 20. The disks 18 are mounted parallel to one another for simultaneous rotation on and by an integrated spindle and motor assembly 26. Information on each magnetic disk surface 20 is read from or written to the disk surface 20 by a corresponding transducer head assembly 28 movable in a path having a radial component across the rotating disk surface 20.

Each transducer head 28 is mounted on a flexure spring (not shown) carried by an arm 32. The arms 32 are ganged together for simultaneous pivotal movement about a support spindle 34. One arm 32 includes an extension 36 driven in pivotal movement by a head drive servo motor 38 including a voice coil 39 cooperating with an internal magnet and core assembly. Drive signals applied to the voice coil 39 cause the arms 32 to move in unison to position the transducer heads 28 in registration with information storage tracks on the disk surfaces 20 where information is written or read.

The disk drive unit 12 is controlled in operation by signals provided by the control unit 14, including motor control signals on line 26A and head position control signals on line 38A. In a typical arrangement, control unit 14 provides an interface with a computer that provides data read and write commands, and data signals are transmitted to or from the transducer heads over corresponding lines 28A, one of which is seen in FIG. 1. Servo position information is recorded on the disk surfaces 20, and the transducer heads 28 read this servo information to provide a servo position signal to the control unit 14. This information is employed by the control unit 14 to provide position control signals on line 38A. The purpose of this position feedback system is to assure accurate and continuous positioning of the transducer heads 28 so that data is written to and read from precise locations on the disk surfaces 20.

Figure 2:
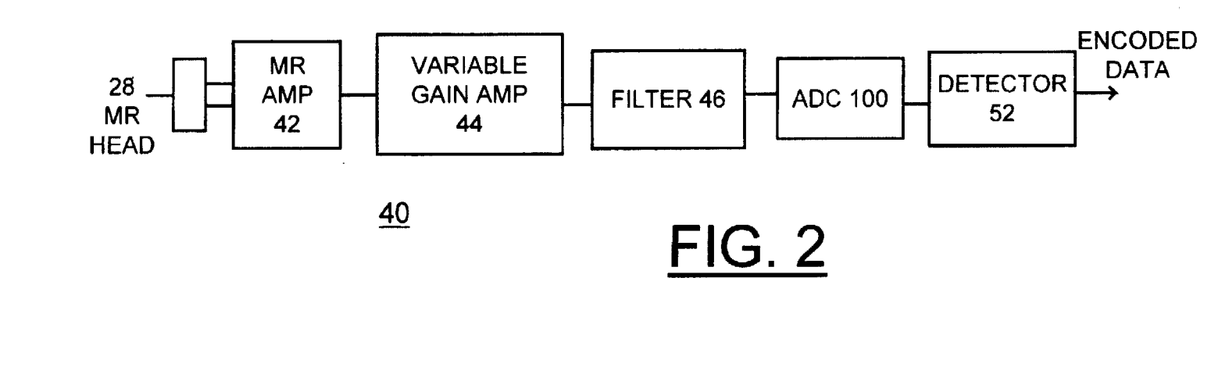
FIG. 2 is a block diagram illustrating a data channel of the data storage disk file of FIG. 1 including a high speed differential analog to digital converter of the present invention.

In FIG. 2, an exemplary data channel generally designated as 40 of the disk drive unit 12 is shown including a high speed differential analog to digital converter (ADC) 100 of the present invention. The read signal from a MR transducer head 28 is amplified by an MR amplifier 42 and applied to a variable gain amplifier 44. The amplified read signal is applied to a filter 46. The filtered read signal is converted to digital form by the ADC 100. A detector 52 is coupled to the ADC 100 receiving digital sample values and providing encoded data.

In FIG. 4 there is shown an exemplary high speed differential analog to digital converter (ADC) generally designated by the reference character 100. The differential ADC has three sections including a driver section 102, a comparator section 104 and a decode section 106. The driver section 102 includes two resistor ladders R1–R32 and R33–R64. Each resistor ladder includes $2^{(N-1)}$ resistors or 32 for the illustrated 6-bit differential flash ADC, where N=6.

Figure 6:
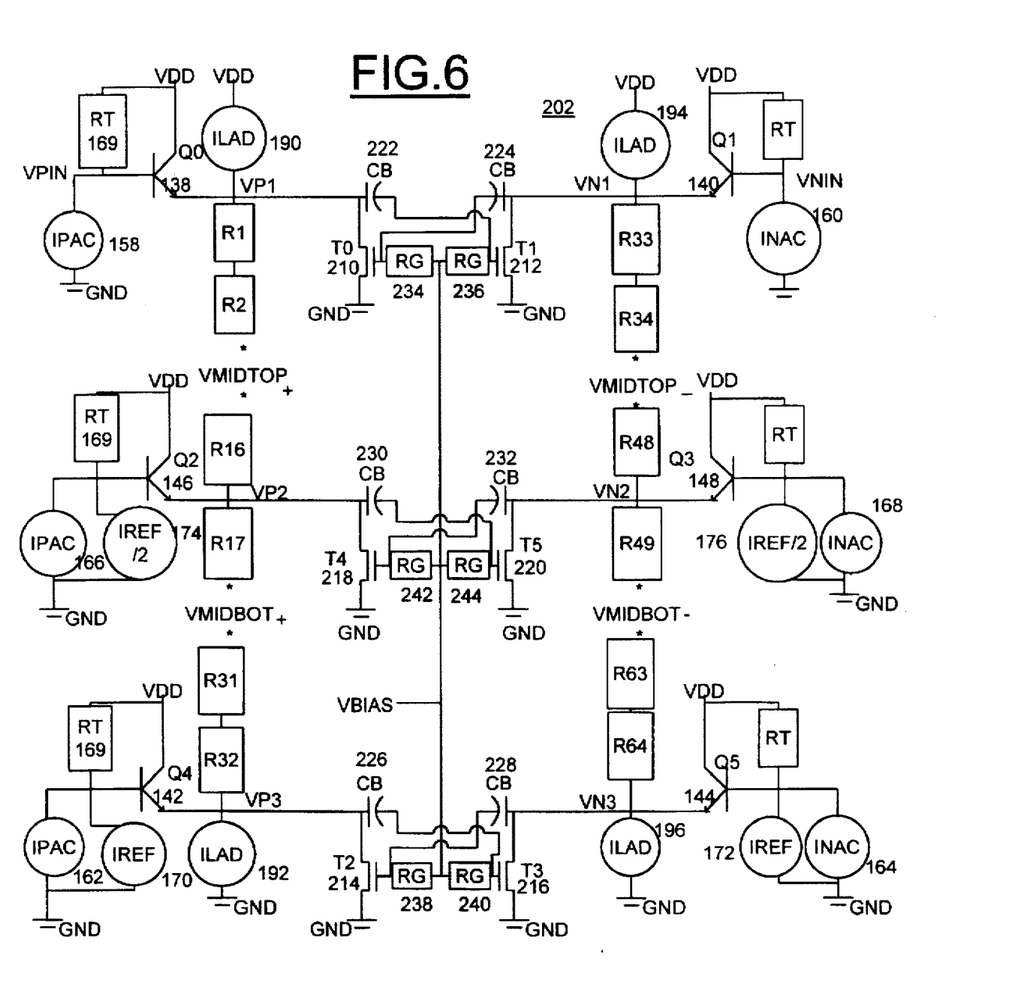
FIG. 6 is a schematic diagram representation of an exemplary high speed differential analog to digital converter driver circuitry with emitter follower current boost in accordance with the invention.

In FIG. 6, there is shown an improved driver section in accordance with the invention generally designated by the reference character 202 for use with the high speed differential ADC 100. The high speed differential ADC driver 202 provides a faster implementation of the differential flash analog to digital converter (ADC) 100 without increasing the power proportionally. In FIG. 6, the same reference characters are used for similar components of high speed differential ADC driver 202 as used for the high speed differential ADC driver 102' of FIG. 5.

In the ADC driver section 202, the voltage sources 118, 120, 122, 124, 126, and 128 of the split ADC driver section 102 of FIG. 4 are replaced by emitter follower transistors Q0–Q5 138, 140, 142, 144, 146, and 148, each driven by a respective AC current source IPAC, INAC 158, 160, 162, 164, 166, and 168. A biasing resistor RT 169 is connected between the supply VDD and the base of each emitter follower transistor Q0–Q5 138, 140, 142, 144, 146, and 148. DC current sources IREF and IREF/2 170, 172, 174 and 176 are provided to set the full scale range of ADC 100. DC current sources ILAD 190, 192, 194, 196 are provided to supply current to the resistor ladders R1–R32, R33–R64 without requiring current from the emitter follower transistors Q0–Q5 138, 140, 142, 144, 146, and 148.

In FIG. 6, DC current sources IB 178, 180, 182, 184, 186, and 188 of driver 102' of FIG. 5 are replaced with the ADC driver section 202. An N-channel field effect transistor (NFET) T0, T1, T2, T3, T4, and T5 210, 212, 214, 216, 218, and 220 replaces a respective DC current source to increase the bias current on the falling edge of the waveform without proportionally increasing the average power. A gate resistor RG 234, 236, 238, 240, 242, 244 is connected between a bias voltage VBIAS and the gate of each of the NFETs T0, T1, T2, T3, T4, and T5 210, 212, 214, 216, 218, and 220. A respective capacitor CB 222,224, 226, 228, 230, and 232 is connected from the emitter of respective emitter follower transistors 138, 140, 142, 144, 146, and 148 to the gate of the respective NFET 212, 210, 216, 214, 220, 218.

Operation of the current source NFETs may be understood as follows. The capacitor CB 222, 226, 230 capacitively couple the emitter of respective emitter follower transistor 138, 142, 146 of the positive phase signal to the control node of respective NFET T1, T3, T5, 212, 216, 220 that supplies current to the negative phase signal. The capacitor CB 224, 228, 232 capacitively couple the emitter of respective emitter follower transistor 140, 144, 148 of the negative phase signal to the control node of respective NFET T0, T2, T4, 210, 214, 218 that supplies current to the positive phase signal. When the voltage at VP1, VP2, VP3 is a rising edge waveform, the voltage at the gate of NFETs T1, T3, T5, 212, 216, 220 is forced up until the charge on respective capacitors CB 222, 226, 230 is leaked through respective resistors RG. The discharge time constant is RG*CB. This forces additional current to be sourced out of respective NFETs T1, T3, T5, 212, 216, 220 which in turn pulls additional current out of nodes VN1, VN2, VN3. This allow nodes VN1, VN2, VN3 to fall faster. Since the voltage at nodes VN1, VN2, VN3 is falling, the current source NFETs T0, T2, T4, 210, 214, 218 are reduced in a similar fashion. This keeps substantially constant average current between NFET pairs T0 and T1, 210, 212, T2 and T3, 214, 216, and T4 and T5, 218, 220 and avoids increase power.

Figure 7A:
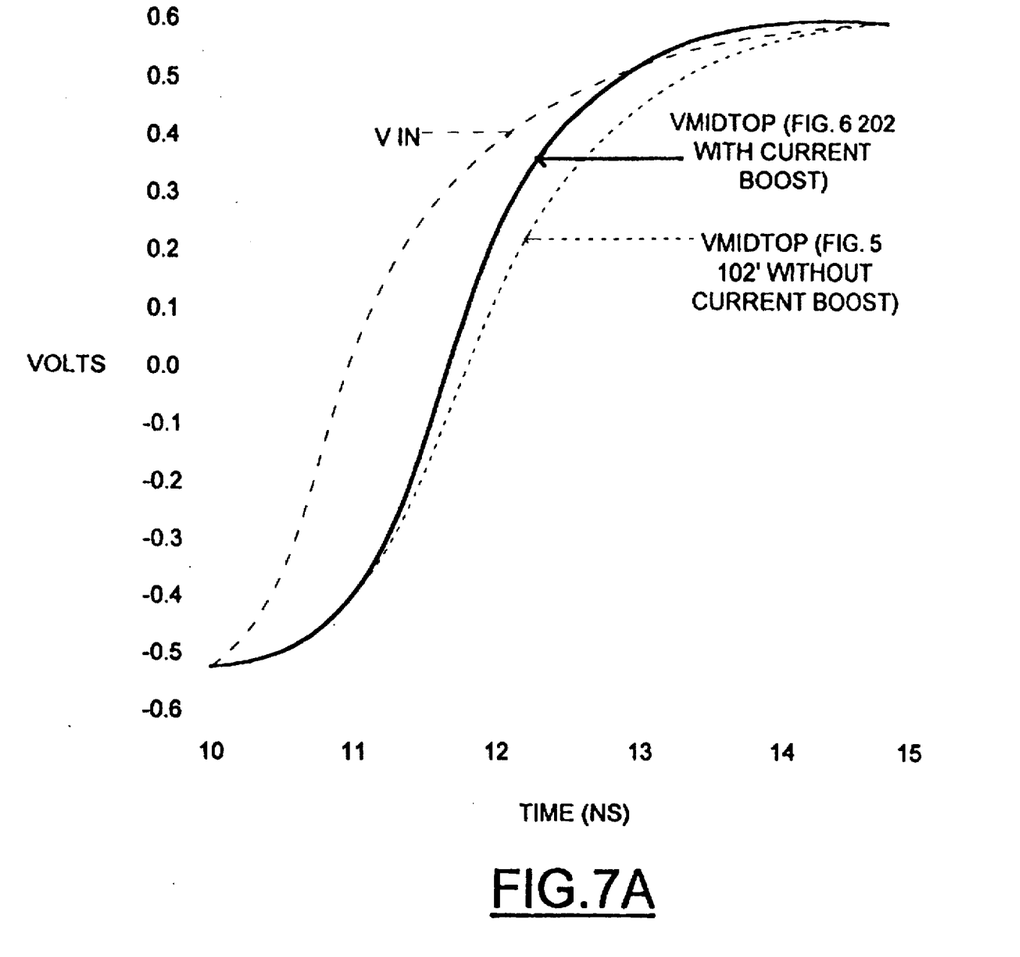
FIG. 7A is a graph illustrating differential voltage step response of the high speed differential analog to digital converter driver circuitry with emitter follower current boost of FIG. 6 of the present invention with respect to driver circuitry without current boost of FIG. 5.
Figure 7B:
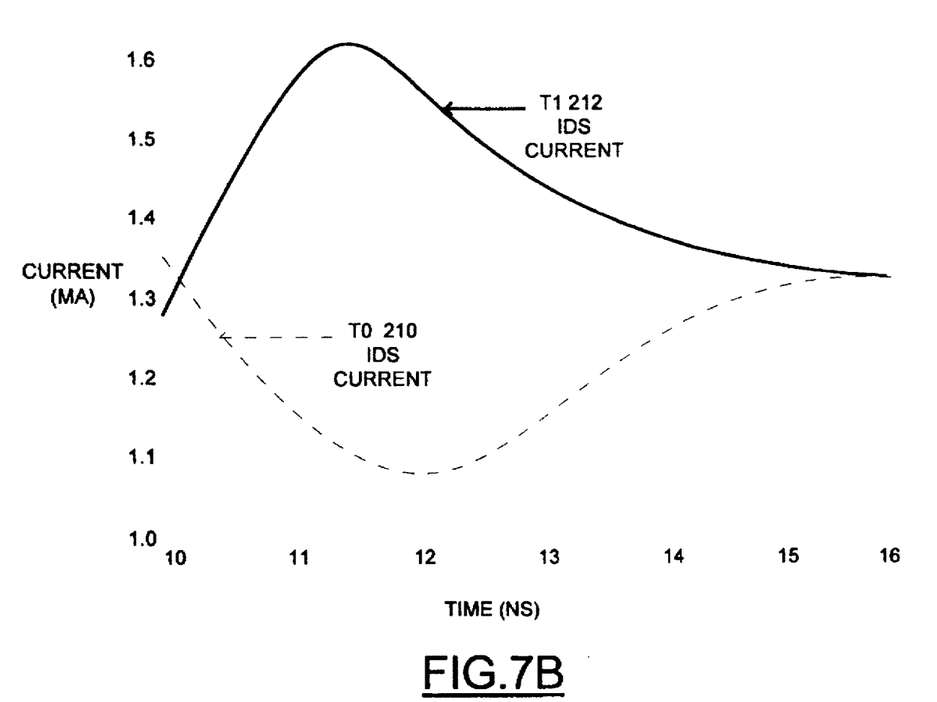
FIG. 7B is a graph illustrating drain to source current of the high speed differential analog to digital converter driver circuitry with emitter follower current boost of FIG. 6 of the present invention.

FIGS. 7A and 7B show the performance gain with high speed differential ADC driver 202 including current boost of FIG. 6 of the present invention. In FIG. 7A, the waveform labeled VIN is the differential voltage produced at nodes VPIN, VNIN from current sources IPAC and INAC, 158, 160. As a result, the voltage at VP1 is rising and the voltage at VN1 is falling. In FIG. 7A, the differential voltage waveform VMIDTOP represents the worse case bandwidth point on the ADC ladder and is shown with the current boost applied by the ADC driver 202 with respect to the ADC driver 102' without current boost applied. VMIDTOP with the current boost of ADC driver 202 of the invention shows approximately 0.75 ns faster settling time than the VMIDTOP without the current boost. If the ADC has only a 1.0 ns margin at capturing the held waveform, a significant performance increase is provided with the current boost of ADC driver 202, substantially without any power increase. The time constant developed by CB*RG is maximized with capacitor CB large enough to drive the gate to source capacitance of the NFET but not too big that it will slow the rising edge of the waveform significantly. In FIG. 5B, the graph shows the corresponding increase in NFET T1 212 drain to source current (IDS) and the decrease of the IDS of NFET T0 210. IDS is nominally 1.3 mA, capacitor CB=0.34 pF and RG=2K ohms.

It should be understood that the present invention can be used with a differential high speed ADC driver that drives only two points on each ladder or can be applied to a differential split flash ADC driver that drives three, four or more points on each ladder. It should be understood that the present invention can be employed in other circuitry that includes a true differential input that has common mode rejection into a comparator input.

While the present invention has been described with reference to the details of the embodiments of the invention shown in the drawing, these details are not intended to limit the scope of the invention as claimed in the appended claims.

What is claimed is:

1. A driver section for a high speed differential analog to digital converter (ADC) comprising:

a pair of series connected resistor ladders;

a positive phase and negative phase emitter follower transistor pair connected to said pair of series connected resistor ladders; each said positive phase and negative phase emitter follower transistor having a collector connected to a supply voltage and having an emitter coupled to a respective one of said pair of series connected resistor ladders;

a respective positive phase and negative phase AC current source driving the base of said respective positive phase and negative phase emitter follower transistor;

a reference DC current source coupled to the base of each said positive phase and negative phase emitter.follower transistors for determining a range of the ADC; and biasing means coupled to said emitter follower transistor pair comprising a current source transistor pair; a first transistor of said current source transistor pair for supplying current to said positive phase emitter follower transistor and a second transistor of said current source transistor pair for supplying current to said negative phase emitter follower transistor, said first transistor having a control node capacitively coupled to the emitter of said negative phase emitter follower transistor and said second transistor having a control node capacitively coupled to the emitter of said positive phase emitter follower transistor.

2. A driver section for a high speed differential analog to digital converter (ADC) as recited in claim 1 includes a capacitor for capacitively coupling each said control node to the respective emitter of said emitter follower transistor pair, and a bias resistor connected between a bias voltage source and each said control node.

3. A driver section for a high speed differential analog to digital converter (ADC) as recited in claim 2 wherein said capacitor and said bias resistor provide a predetermined time constant.

4. A driver section for a high speed differential analog to digital converter (ADC) as recited in claim 3 wherein said capacitor has a value of about 0.34 pF and said biasing resistor has a value of 2K ohms.

5. A driver section for a high speed differential analog to digital converter (ADC) as recited in claim 1 wherein said current source transistor pair include a pair of field effect transistors.

6. A driver section for a high speed differential analog to digital converter (ADC) as recited in claim 5 wherein said control node comprises a gate of said field effect transistors.

7. A driver section for a high speed differential analog to digital converter (ADC) as recited in claim 1 wherein said current source transistor pair include series connected bias resistors connected between said control nodes of said first and second transistors.

8. A driver section for a high speed differential analog to digital converter (ADC) as recited in claim 7 wherein a junction of said series connected bias resistors is connected to a bias voltage source.

9. A direct access storage device including a data channel comprising:

at least one disk mounted for rotation about an axis and having at least one disk surface for storing data;

transducer means mounted for movement across said disk surface for reading and writing data to said disk surface;

an analog to digital converter (ADC) coupled to said transducer means for converting an analog input signal to digital sample values including:

a pair of series connected resistor ladders;

a positive phase and negative phase emitter follower transistor pair connected to said pair of series connected resistor ladders; each said positive phase and negative phase emitter follower transistor having a collector connected to a supply voltage and having an emitter coupled to a respective one of said pair of series connected resistor ladders;

a respective positive phase and negative phase AC current source driving the base of said respective positive phase and negative phase emitter follower transistors;

a reference DC current source coupled to the base of each said positive phase and negative phase emitter follower transistor for determining a range of the ADC; and biasing means coupled to said emitter follower transistor pair comprising a current source transistor pair; a first transistor of said current source transistor pair for supplying current to said positive phase emitter follower transistor and a second transistor of said current source transistor pair for supplying current to said negative phase emitter follower transistor, said first transistor having a control node capacitively coupled to the emitter of said negative phase emitter follower transistor and said second transistor having a control node capacitively coupled to the emitter of said positive phase emitter follower transistor.

10. A direct access storage device as recited in claim 9 wherein said ADC includes a capacitor for capacitively coupling each said control node to the respective emitter of said emitter follower transistor pair, and a bias resistor connected between a bias voltage source and each said control node.

11. A direct access storage device as recited in claim 10 wherein said capacitor and said bias resistor provide a predetermined time constant.

12. A direct access storage device as recited in claim 10 wherein said capacitor has a value of about 0.34 pF and said biasing resistor has a value of 2K ohms.

13. A direct access storage device as recited in claim 9 wherein said analog input signal coupled to the base of said respective positive phase and negative phase emitter follower transistors.

14. A direct access storage device as recited in claim 9 wherein said current source transistor pair include a pair of field effect transistors and wherein said control nodes comprise a gate of said field effect transistors.

15. A direct access storage device as recited in claim 9 wherein said current source transistor pair include series connected bias resistors connected between said control nodes of said first and second transistors and wherein a junction of said series connected bias resistors is connected to a bias voltage source.

16. A high speed differential driver for a comparator comprising:

a positive phase and negative phase emitter follower transistor pair; each said positive phase and negative phase emitter follower transistor having a collector connected to a supply voltage and having an emitter coupled to a respective one of an inverting and non-inverting input of the comparator;

a respective positive phase and negative phase AC current source driving the base of said respective positive phase and negative phase emitter follower transistor;

a reference DC current source coupled to the base of each said positive phase and negative phase emitter follower transistor for providing a DC voltage value; and biasing means coupled to said emitter follower transistor pair comprising a current source transistor pair; a first transistor of said current source transistor pair for supplying current to said positive phase emitter follower transistor and a second transistor of said current source transistor pair for supplying current to said negative phase emitter follower transistor, said first transistor having a control node capacitively coupled to the emitter of said negative phase emitter follower transistor and said second transistor having a control node capacitively coupled to the emitter of said positive phase emitter follower transistor.

17. A high speed differential driver for a comparator as recited in claim 16 wherein said current source transistor pair include a biasing resistor connected between a bias voltage source and each said control node and a capacitor for capacitively coupling each said control node to the respective emitter of said emitter follower transistor pair.

18. A high speed differential analog to digital converter (ADC) comprising:

a driver section including a pair of series connected resistor ladders;

a positive phase and negative phase emitter follower transistor pair connected to said pair of series connected resistor ladders; each said positive phase and negative phase emitter follower transistor having a collector connected to a supply voltage and having an emitter coupled to a respective one of said pair of series connected resistor ladders;

a respective positive phase and negative phase AC current source driving the base of said respective positive phase and negative phase emitter follower transistors;

a reference DC current source coupled to the base of each said positive phase and negative phase emitter follower transistor for determining a range of the ADC; and biasing means coupled to said emitter follower transistor pair comprising a current source transistor pair; a first transistor of said current source transistor pair for supplying current to said positive phase emitter follower transistor and a second transistor of said current source transistor pair for supplying current to said negative phase emitter follower transistor, said first transistor having a control node capacitively coupled to the emitter of said negative phase emitter follower transistor and said second transistor having a control node capacitively coupled to the emitter of said positive phase emitter follower transistor;

a comparator section including a series string of comparators; a differential input signal at respective center taps between series connected resistors of said pair of series connected resistor ladders coupled into an inverting input and a non-inverting input of respective comparators; and a decode section; outputs of said series string of comparators coupled to said decode section for providing a digital output.

* * * * *